United States Patent [19]
Kil et al.

[11] Patent Number: 6,100,203
[45] Date of Patent: Aug. 8, 2000

[54] METHODS OF EMPLOYING AQUEOUS CLEANING COMPOSITIONS IN MANUFACTURING MICROELECTRONIC DEVICES

[75] Inventors: Joon-ing Kil, Kyungki-do; Pil-kwon Jun, Seoul; Min-sang Yun, Kyungki-do; Young-hwan Yun, Seoul; Gyu-hwan Kwack; Sang-moon Chon, both of Kyungki-do, all of Rep. of Korea

[73] Assignee: Samsung Electronics Co., Ltd., Rep. of Korea

[21] Appl. No.: 09/116,790

[22] Filed: Jul. 16, 1998

[30] Foreign Application Priority Data

Jul. 25, 1997 [KR] Rep. of Korea ........................ 97-35185

[51] Int. Cl.$^7$ .................................................. H01L 21/302
[52] U.S. Cl. .......................... 438/745; 438/753; 438/756; 216/96; 216/99
[58] Field of Search .................................... 438/386, 387, 438/392, 393, 396, 397, 398, 745, 753, 756, 757; 216/99, 96

[56] References Cited

U.S. PATENT DOCUMENTS

| | | | |
|---|---|---|---|
| 4,171,242 | 10/1979 | Liu | 216/99 |
| 5,340,763 | 8/1994 | Dennison | 438/396 |
| 5,622,889 | 4/1997 | Yoo et al. | 438/397 |
| 5,858,837 | 1/1999 | Sakoh et al. | 438/398 |
| 5,902,126 | 5/1999 | Hong et al. | 438/396 |
| 5,928,969 | 7/1999 | Li et al. | 438/753 |

*Primary Examiner*—Benjamin L. Utech
*Assistant Examiner*—Duy-Vu Deo
*Attorney, Agent, or Firm*—Myers Bigel Sibley & Sajovec, P.A.

[57] ABSTRACT

Aqueous cleaning compositions comprise from about 0.01 to about 10 weight percent of hydrogen fluoride; from about 1 to about 10 weight percent of hydrogen peroxide; and from about 0.01 to about 30 weight percent of isopropyl alcohol. Methods of manufacturing microelectronic devices comprise providing electrodes on insulation films on microelectronic substrates; etching the insulation films using the electrodes as etching masks to form an exposed surfaces on the electrodes; cleaning the exposed surfaces with aqueous cleaning compositions comprising from about 0.01 to about 10 weight percent of hydrogen fluoride; from about 1 to about 10 weight percent of hydrogen peroxide; and from about 0.01 to about 30 weight percent of isopropyl alcohol; and forming dielectric films on the exposed surfaces of the electrodes. The cleaning step and the etching step are carried out simultaneously.

11 Claims, 2 Drawing Sheets

METHODS OF EMPLOYING AQUEOUS CLEANING COMPOSITIONS IN MANUFACTURING MICROELECTRONIC DEVICES

FIELD OF THE INVENTION

The invention generally relates to cleaning compositions used in conjunction with microelectronic devices.

BACKGROUND OF THE INVENTION

Microelectronic devices such as integrated circuits are widely used in consumer and industrial products. One widely used microelectronic device is a microelectronic memory device that includes unit cells for storing information therein. An example of a conventional microelectronic memory device is a Dynamic Random Access Memory (DRAM) which typically has a unit cell comprising a Metal Oxide Semiconductor (MOS) transistor and a capacitor for storing information. Due to the increased integration of microelectronic devices, the potential memory space available in the unit cell may be decreasing. Thus, efforts have been made to increase the effective surface area of the capacitor. One effort, for example, has focused on employing different materials in the capacitor.

Another attempt at potentially increasing the capacitance relates to etching the lower side of the storage electrode which is used as the lower electrode of the capacitor, and forming a hemispherical-shaped grained silicon (HSG-Si) layer containing polysilicon on the lower electrode surface.

In general, the fabrication of highly integrated microelectronic devices typically involves the formation of undesired contaminants such as, for example, particles, metal impurities, organic materials, moisture, and the like, along with a native oxide film. It is usually desirable to remove these contaminants by employing a conventional cleaning composition. One example of a conventional cleaning composition is a mixture of ammonium hydroxide, hydrogen peroxide, and water ("SC-1"). Notwithstanding any potential advantages associated with using SC-1, problems may occur when using the composition on a device containing an HSG-Si layer. For example, the SC-1 solution often excessively consumes the HSG-Si layer. In this instance, an oxide film typically containing $SiO_2$ may form on the surface of HSG-Si film typically via the reaction between the hydrogen peroxide in the SC-1 and the silicon in the HSG-Si film. Hydrogen peroxide is ionized according to reaction (I) and the silicon reacts with the ionized product and hydrogen peroxide as illustrated in reactions (II) and (Ill):

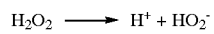

(I)

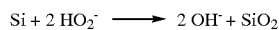

(II)

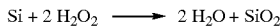

(III)

It is typically desirable to remove the silicon dioxide film formed by the above reactions. In doing so, however, the effective area of the capacitor present on the surface of the HSG-Si film is often decreased. Thus, it would be desirable to obtain cleaning compositions and methods of using the same which may allow for removal of a silicon dioxide film without excessive loss of capacitor area.

SUMMARY OF THE INVENTION

It is an object of the present invention to provide cleaning compositions and methods of using the same which can allow for the removal of silicon dioxide from a microelectronic device without excessive loss of capacitor area.

It is another object of the invention to provide cleaning compositions and methods of using the same which potentially does not result in loss of HSG-Si film.

It is yet another object of the invention to provide cleaning compositions and methods of using the same which yields potentially high cleaning efficiencies.

It is another object of the invention to provide cleaning compositions and methods of using the same which may allow for the fabrication of microelectronic devices to be carried out in a simpler manner.

These objects and others are provided by aqueous cleaning compositions used in the manufacture of microelectronic devices. The aqueous cleaning compositions comprise from about 0.01 to about 10 weight percent of hydrogen fluoride; from about 1 to about 10 weight percent of hydrogen peroxide; and from about 0.01 to about 30 weight percent of isopropyl alcohol.

In another aspect, the invention provides methods of manufacturing microelectronic devices. The methods comprise providing electrodes on insulation films on microelectronic substrates; etching the insulation films using the electrodes as etching masks to form exposed surfaces on the electrodes;

cleaning the exposed surfaces with aqueous cleaning compositions comprising from about 0.01 to about 10 weight percent of hydrogen fluoride; from about 1 to about 10 weight percent of hydrogen peroxide; and from about 0.01 to about 30 weight percent of isopropyl alcohol; and forming dielectric films on the exposed surfaces of the electrode. The cleaning step and the etching step are carried out simultaneously.

In yet another aspect, the invention provides methods of manufacturing microelectronic devices. The methods comprise providing electrodes on insulation films on microelectronic substrates; etching the insulation films using the electrodes as etching masks to form exposed surfaces on the electrodes; cleaning the exposed surfaces with aqueous cleaning compositions comprising from about 0.01 to about 10 weight percent of hydrogen fluoride; from about 1 to about 10 weight percent of hydrogen peroxide; and from about 0.01 to about 30 weight percent of isopropyl alcohol; forming HSG-Si layers on surfaces of the electrodes; and forming dielectric films on the surface of the exposed lower electrodes. The etching step and the cleaning step are carried out simultaneously.

DETAILED DESCRIPTION OF THE PREFERRED EMBODIMENTS

Figure 1:
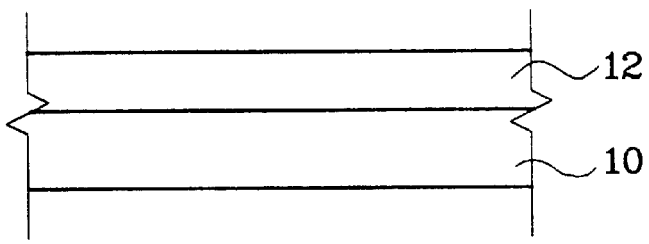
FIGS. 1, 2, 3, 4, 5 are cross-sectional views of methods of forming microelectronic devices according to the present invention employing the illustrated fabrication steps.

The present invention now will be described more fully hereinafter with reference to the accompanying drawings and examples, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity.

Like numbers refer to like elements throughout. It will also be understood that when a layer is referred to as being "on" another layer or substrate, it can be directly on the other layer or substrate, or intervening layers may also be present.

In one aspect, the invention relates to aqueous cleaning compositions for use in the manufacture of microelectronic devices such as, for example, semiconductor devices. The aqueous cleaning compositions comprise from about 0.01 to about 10 weight percent of hydrogen fluoride (i.e., HF), from about 1 to about 10 weight percent of hydrogen peroxide (i.e., $H_2O_2$), and from about 0.01 to about 30 weight percent of isopropyl alcohol (i.e., IPA). In one embodiment, water may make up the remainder of the compositions. Deionized water may be used in the aqueous cleaning compositions. The above percents are all based on the weights of the compositions.

The aqueous cleaning compositions may comprise various amounts of the above components. In one embodiment, the aqueous cleaning compositions may comprise about 0.2 weight percent of hydrogen fluoride, about 3 weight percent of hydrogen peroxide, about 30 weight percent of isopropyl alcohol, and the remainder water. In a second embodiment, the aqueous cleaning compositions may comprise about 0.5 weight percent of hydrogen fluoride, about 3 weight percent of hydrogen peroxide, about 30 weight percent of isopropyl alcohol, and the remainder water. This composition may be especially desirable in cleaning and removing oxide films. In a third embodiment, the aqueous cleaning compositions may comprise about 0.9 weight percent of hydrogen fluoride, about 3 weight percent of hydrogen peroxide, about 30 weight percent of isopropyl alcohol, and the remainder water. This composition may be especially desirable for etching and cleaning.

Although not wishing to be bound by any theories, Applicants believe that the hydrogen fluoride may function to potentially remove the oxide film from the wafer surface, increase the passivation of the wafer surface, and reduce the adhesion or addition of impurities to the wafer surface. The purity of a commercially available hydrogen fluoride solution which may used in forming an aqueous cleaning composition is typically about 49 percent. It should be appreciated, however, that hydrogen fluoride solutions of other purities may also be used.

It is believed that the hydrogen peroxide may increase the removal efficiency of metal such as, for example, copper. Since the hydrogen peroxide typically functions as a strong oxidizing agent, and since it is capable of generating nascent oxygen by dissolution in water, it can be readily prepared so as to have a purity level suitable for commercial use.

It is believed that the isopropyl alcohol is able to decrease the concentration of impurity particles which may be present on a microelectronic device (e.g.,wafer) surface. Since the isopropyl alcohol is able to decrease the free energy of the wafer surface, the cleaning efficiency of the aqueous cleaning compositions may be optimized.

The aqueous cleaning compositions may be prepared in accordance with known and accepted techniques. Preferably, the compositions are prepared by first mixing and combining deionized water and isopropyl alcohol. Hydrogen peroxide is then added to this mixture, and finally hydrogen fluoride is added. The aqueous cleaning compositions are typically adjusted by varying the concentration of hydrogen fluoride relative to the other ingredients.

In another aspect, the invention provides methods of manufacturing microelectronic devices. The methods comprise providing electrodes on insulation films on microelectronic substrates; etching the insulation films using the electrodes as etching masks to form exposed surfaces on the electrodes; cleaning the exposed surfaces with aqueous cleaning compositions comprising from about 0.01 to about 10 weight percent of hydrogen fluoride; from about 1 to about 10 weight percent of hydrogen peroxide; and from about 0.01 to about 30 weight percent of isopropyl alcohol; and forming dielectric films on the exposed surfaces of the electrodes. Advantageously, the cleaning and etching steps are simultaneously carried out.

Preferably, the etching steps comprise undercutting the insulation films using the electrodes as etching masks to form exposed surfaces on the electrodes.

The insulation films preferably comprise silicons such as polysilicon, amorphous silicon, and composites thereof. Impurities may or may not be injected into the insulation films.

The microelectronic substrates preferably comprises a material selected from the group consisting of polysilicon, amorphous silicon, and composites thereof.

The above methods may also comprise additional steps. In particular, the methods may comprise forming HSG-Si films on the exposed surfaces of the electrodes subsequent to the cleaning steps, wherein contaminant and oxide-containing films are present on the HSG-Si films; and applying aqueous cleaning compositions to the HSG-films to remove the contaminants and the oxide-containing films. If desired, the aqueous cleaning compositions may be applied to the surface of the wafer to clean the surface. Examples of contaminants which may be removed include, but are not limited to, particles, metal impurities, organic materials, moisture, and mixtures thereof. Oxide-containing films typically comprise silicon oxides, and more specifically, silicon dioxide ($SiO_2$).

In yet another aspect, the invention provides methods of manufacturing microelectronic devices. The methods comprise providing electrodes on insulation films on microelectronic substrates; etching the insulation films using the electrodes as etching masks to form exposed surfaces on the electrodes; cleaning the exposed surfaces with the aqueous cleaning compositions described herein; forming HSG-Si layers on surfaces of the electrodes; and forming dielectric films on the surface of the exposed lower electrodes. The etching step and the cleaning step are carried out simultaneously.

Preferably, the etching step comprises undercutting the insulation film using the electrode as an etching mask to form an exposed surface on the electrode. In another preferred embodiment, an oxide-containing film may also be present on the exposed surface, and the cleaning step comprises cleaning the exposed surface the exposed surface with the aqueous cleaning composition.

The invention will now be illustrated in greater detail with reference to the accompanying drawings. In general, FIGS. 1–5 show a DRAM of a semiconductor device, and in particular a capacitor portion of the DRAM. Referring to FIG. 1, an insulation film 12 is formed on a microelectronic substrate 10 (e.g., semiconductor substrate). In this embodiment, silicon is used in substrate 10. Impurities which may be present in the substrate can be removed from the active element region by a conventional process, or more specifically, by the process described hereinbelow.

Typically, the insulation film 12 acts as an intermediate insulation film which can be a single- or a multi-layered structure. The film may contain various materials such as, but not limited to, oxides, nitrides, high-temperature oxides, and the like. For the purposes of the invention, it is preferred to use a high-temperature oxide (HTO) material in insulation film 12.

Figure 2:
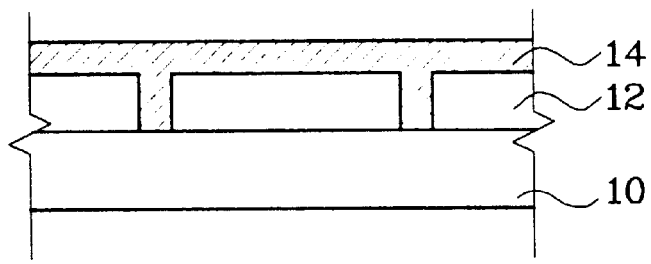

Referring now to FIG. 2, contact holes are formed in insulation film 12. A polysilicon layer 14 is formed as a first conductive layer on the insulation film 12 and fills the contact holes. Typically, the polysilicon layer 14 serves as a storage electrode, namely as the lower electrode of a capacitor where impurities can be injected if so desired. However, the invention is equally applicable to other electrodes as well. Amorphous silicon or other conductive materials can be used in layer 14.

Figure 3:
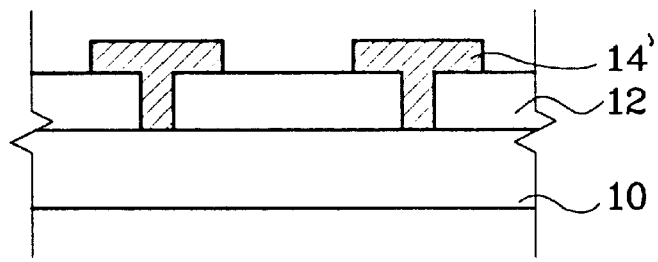

FIG. 3 illustrates the formation of a storage electrode 14' by employing a conventional photo-lithography process to pattern layer 14.

Figure 4:
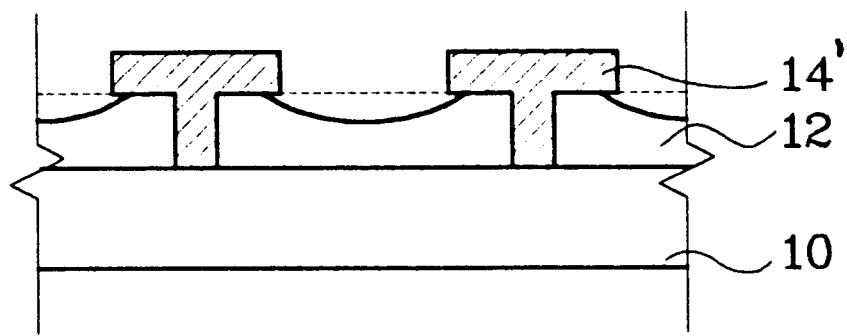

FIG. 4 illustrates the etching of a portion of a lower side of storage electrode 14' in an attempt to increase the effective area of the capacitor. As shown, the insulation film 12 becomes undercut. In order to carry out the undercutting, isotropic wet-etching is typically performed on the wafer surface. Thereafter, the surface may cleaned using, for example, the conventional SC-1 cleaner described herein. This conventional processing is typically carried out in two steps.

Advantageously, the invention allows for the above process to potentially be carried out in one step. More specifically, the undercut and the cleaning may be performed at the same time by using cleaning compositions of the invention. It is preferred to use a composition comprising 0.9 weight percent of hydrofluoric acid, 3 weight percent of hydrogen peroxide, 30 weight percent of isopropyl alcohol, and the remainder water.

Figure 5:
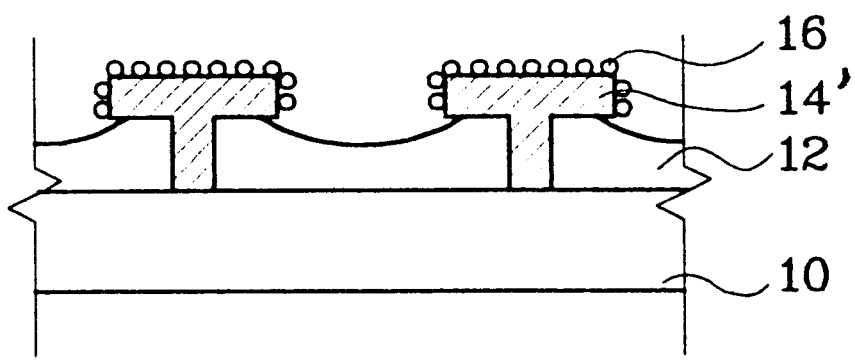

FIG. 5 illustrates the formation of an HSG-Si film denoted by 16. The film 16 is formed on the exposed surface of the storage electrode 14'. The presence of the film is intended to increase the effective area of the capacitor by virtue of the hemispherical grains. The HSG-Si film may employ, for example, amorphous silicon (a-Si), polysilicon, or composites thereof. The film 16 may be formed by techniques known in the art such as, for example, a Low Pressure Chemical Vapor Deposition (LPCVD) method. Impurities or phosphorous are then doped therein. The HSG-Si film is typically characterized by the formation of a hemispherical shaped region at the temperature range of transition between crystal silicon and amorphous silicon. In this range, silicon migration is capable of occurring, and the surface energy of the silicon usually experiences the highest level of stability. Stated differently, it is believed that by virtue of the formation of the HSG-Si film, the capacitance of the capacitor is increased virtue of silicon gases having relatively high surface reactivities, e.g., $Si_2H_6$, or $SiH_4$, forming certain protrusion-shaped regions around the structurally-abnormal sites and deposited particles on the wafer surface. These sites and deposited particles may function as seed material such that the resulting wafer surface is potentially rough. Thus, the surface space may be expanded.

In a conventional process, a dielectric film is typically formed on the HSG-Si film. Prior to the formation of the HSG-Si film, the wafer surface is usually cleaned using a conventional SC-1 solution described herein. The native oxide film formed on the storage electrode pattern 14' and the HSG-Si film may be removed by employing a dilute hydrogen fluoride solution, which is typically carried out in two individual steps. In contrast, subsequent to the formation of the HSG-Si film, the present invention allows for the above two steps to be potentially carried out in one step. In the single step, the wafer surface is cleaned and the native oxide film is removed by virtue of employing the aqueous cleaning composition of the invention.

Subsequent to the formation of a capacitor dielectric film on the exposed surface of the cleaned storage electrode pattern 14', an upper electrode capacitor film is formed so as to complete the formation of the capacitor.

Referring again to FIG. 3, a method of manufacturing a microelectronic (e.g., semiconductor) device is presented according to another embodiment of the invention. In this embodiment, a storage electrode pattern 14' is formed, and an HSG-Si film is formed on the pattern 14' without using separate undercutting and cleaning steps. By virtue of using the aqueous cleaning composition of the invention, one step may be employed to potentially achieve the results obtained by using separate undercutting and cleaning steps as conventionally practiced. Preferably, the aqueous cleaning composition which is employed in the single step comprises 0.9 weight percent of hydrofluoric acid, 3 weight percent of hydrogen peroxide, 30 weight percent of isopropyl alcohol, and the remainder water.

The invention will now be described in greater detail with reference to the examples which follow. It should be understood that the examples are set forth only to illustrate the invention, and are not meant as a limitation thereof.

EXAMPLE 1

A storage electrode pattern 14' is formed on a wafer surface, and then an HSG-Si film 16 is formed on the exposed wafer surface. Undercutting, cleaning, and oxide removal processes are then carried out by using an aqueous cleaning composition of the invention comprising 0.9 weight percent of hydrogen fluoride, 3 weight percent of hydrogen peroxide, and 30 weight percent of isopropyl alcohol. Thereafter, a dielectric film and an upper electrode are formed.

For the purposes of comparison, a wafer was undercut and cleaned using conventional techniques. More specifically, a storage electrode pattern was formed, and a cleaning in connection with the isotropic etching was carried out with an SC-1 solution for 5 minutes. After formation of an HSG-Si film, the SC-1 solution was applied for 5 minutes. An oxide film which was present as a result of the above processing was then removed with hydrogen fluoride, and a dielectric film and upper electrode were then formed.

The wafers used in conjunction with the aqueous cleaning compositions of the invention and the prior art cleaning compositions employ insulation films comprising high-temperature oxide materials. The storage electrode patterns in both instances comprise polysilicon.

Table 1 illustrates a comparison of the effect of a conventional cleaning processes and a cleaning process in accordance with the invention on wafers. Although not wishing to be bound by any theory, it is believed that since the wafer cleaned in accordance with the invention experiences little HSG wear, the effective space of the capacitor may be larger relative to a conventionally cleaned wafer. The rate of minimum capacitance (Cmin) is increased by 1.41 ft and the rate of maximum capacitance (Cmax) is increased by 6 percent.

TABLE 1

| Classification<br>HSG wear | prior art<br>Wear | Invention<br>No wear |
|---|---|---|
| Cmin (standard dev.) | 29.25 (0.9) ft | 30.66 (1.1) |
| Cmax (standard dev.) | 33.3 (1.25) ft | 32.69 (1.11) |
| Rate (standard dev.) | 87.86 (2.89) % | 93.89 (4.48) |
| Breakdown voltage<br>(standard dev.) | 4.32 (0.04) V | 4.3 (0.06) | standard dev. refers to the standard deviation

EXAMPLE 2

Particle removal efficiency, metal contaminant removal rate, and surface roughness were determined for polysilicon and HTO film wafers cleaned with prior art cleaning compositions (combinations of SC1 and HF) and aqueous cleaning compositions of the invention. The results are set forth in Table 2. As shown therein, the wafer cleaning in accordance with the invention exhibit improved properties.

TABLE 2

| | Prior Art<br>(SC-1 +<br>hydrogen fluoride) | | Invention | |
|---|---|---|---|---|
| Classification | Poly silicon | HTO film | Poly silicon | HTO film |
| Particle removal<br>Efficiency (%) | 96.23 | 98.0 | 96.3 | 98.3 |
| Removal rate of<br>metal contaminant<br>(1 eatoms/cm$^2$) | Cu: 0.67<br>Fe: 26.89 | Cu: <0.5<br>Fe: <0.5 | Cu: <0.5<br>Fe: 2.1 | Cu: 0.5<br>Fe: <0.5 |
| Surface roughness<br>RMS (ra) | 0.89 | 0.82 | 0.86 | 0.71 |

The invention offers potential advantages. The use of the aqueous cleaning compositions described herein allows for improved cleaning as measured by particle removal efficiency and metal contaminant removal rate. Additionally, HSG-Si films cleaned by the compositions of the invention are capable of exhibiting reduced wear relative to conventionally cleaned wafers.

In the drawings, examples, and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of manufacturing a microelectronic device comprising:
   providing an electrode on an insulation film on a microelectronic substrate;
   etching the insulation film using the electrode as an etching mask to form an exposed surface on the electrode;
   cleaning the exposed surface with an aqueous cleaning composition consisting essentially of from about 0.01 to about 10 weight percent of hydrogen fluoride; from about 1 to about 10 weight percent of hydrogen peroxide; and from about 0.01 to about 30 weight percent of isopropyl alcohol; and
   forming a dielectric film on the exposed surface of the electrode; wherein said cleaning step and said etching step are carried out simultaneously.

2. A method according to claim 1, wherein said etching step comprises undercutting the insulation film using the electrode as an etching mask to form an exposed surface on the electrode.

3. A method according to claim 1, wherein the electrode comprises a material selected from the group consisting of polysilicon, amorphous silicon, and composites thereof.

4. A method according to claim 1, wherein the cleaning step comprises cleaning the exposed surface with an aqueous cleaning composition comprising about 0.2 weight percent of hydrogen fluoride, about 3 weight percent of hydrogen peroxide, and about 30 weight percent of isopropyl alcohol.

5. A method according to claim 1, wherein the cleaning step comprises cleaning the exposed surface with an aqueous cleaning composition comprising about 0.5 weight percent of hydrogen fluoride, about 3 weight percent of hydrogen peroxide, and about 30 weight percent of isopropyl alcohol.

6. A method according to claim 1, wherein the cleaning step comprises cleaning the exposed surface with an aqueous cleaning composition comprising about 0.9 weight percent of hydrogen fluoride, about 3 weight percent of hydrogen peroxide, and about 30 weight percent of isopropyl alcohol.

7. A method of manufacturing a microelectronic device comprising:
   providing an electrode on an insulation film on a microelectronic substrate:
   etching the insulation film using the electrode as an etching mask to form an exposed surface on the electrode;
   cleaning the exposed surface with an aqueous cleaning composition comprising from about 0.01 to about 10 weight percent of hydrogen fluoride; from about 1 to about 10 weight percent of hydrogen peroxide; and from about 0.01 to about 30 weight percent of isopropyl alcohol;
   forming an HSG-Si film on the exposed surface of the electrode subsequent to said cleaning step, wherein a contaminant and an oxide-containing film are present on the HSG-Si film;
   applying an aqueous cleaning composition to the HSG-film to remove the contaminants and the oxide-containing film, the aqueous cleaning composition comprising from about 0.01 to about 10 weight percent of hydrogen fluoride; from about 1 to about 10 weight percent of hydrogen peroxide; and from about 0.01 to about 30 weight percent of isopropyl alcohol; and
   forming a dielectric film on the exposed surface of the electrode;
   wherein said cleaning step and said etching step are carried out simultaneously.

8. A method according to claim 7, wherein the contaminant comprises at least one material selected from the group consisting of particles, metal impurities, organic materials, moisture, and mixtures thereof.

9. A method according to claim 7, wherein said applying step comprises applying an aqueous cleaning composition comprising about 0.2 weight percent of hydrogen fluoride, about 3 weight percent of hydrogen peroxide, and about 30 weight percent of isopropyl alcohol.

10. A method according to claim 7, wherein said applying step comprises applying an aqueous cleaning composition comprising about 0.5 weight percent of hydrogen fluoride, about 3 weight percent of hydrogen peroxide, and about 30 weight percent of isopropyl alcohol.

11. A method according to claim 7, wherein said applying step comprises applying an aqueous cleaning composition comprising about 0.9 weight percent of hydrogen fluoride, about 3 weight percent of hydrogen peroxide, and about 30 weight percent of isopropyl alcohol.

* * * * *